United States Patent [19]

Safir

[11] Patent Number: 5,665,175
[45] Date of Patent: Sep. 9, 1997

[54] BIFACIAL SOLAR CELL

[76] Inventor: Yakov Safir, Giesegaardvej 104, DK-4100 Ringsted, Denmark

[21] Appl. No.: 512,161

[22] Filed: Aug. 7, 1995

Related U.S. Application Data

[62] Division of Ser. No. 949,539, Jan. 14, 1993, Pat. No. 5,461,002.

[30] Foreign Application Priority Data

May 30, 1990 [DK] Denmark ................. 1338/90

[51] Int. Cl.⁶ ........................................... H01L 31/06
[52] U.S. Cl. .............................................. 136/255
[58] Field of Search ........................ 136/255, 256, 136/261

[56] References Cited

U.S. PATENT DOCUMENTS

| | | | |
|---|---|---|---|
| 2,794,846 | 6/1957 | Fuller | 136/256 |
| 3,767,485 | 10/1973 | Sahagon | 437/164 |
| 3,990,100 | 11/1976 | Mimine et al. | 257/437 |
| 4,075,044 | 2/1978 | Jager et al. | 437/95 |
| 4,101,351 | 7/1978 | Shah et al. | 437/2 |
| 4,329,772 | 5/1982 | Oikawa et al. | 437/6 |
| 4,543,444 | 9/1985 | Rasch et al. | 136/256 |
| 4,701,427 | 10/1987 | Boecker et al. | 501/92 |
| 4,720,469 | 1/1988 | Koser et al. | 437/143 |
| 4,914,500 | 4/1990 | Liu et al. | 257/384 |
| 5,082,791 | 1/1992 | Micheels et al. | 437/2 |
| 5,225,235 | 7/1993 | Yoshiharu et al. | 428/66.7 |

FOREIGN PATENT DOCUMENTS

WO86/05922  10/1986  WIPO .

OTHER PUBLICATIONS

"Prevention of Autodoping", IBM Technical Disclosure Bulletin, vol. 16, No. 1, Jun. 1973, p. 29.

*Primary Examiner*—Aaron Weisstuch
*Attorney, Agent, or Firm*—Finnegan, Henderson, Farabow, Garrett & Dunner

[57] ABSTRACT

A bifacial solar cell including a semiconductor substrate wafer, a first active area of a first conductivity type provided on at least a part of a first side of the wafer and a second active area of a second conductivity type provided on a second side of the wafter, the edge face of the wafter and the periphery of said first side of the wafter. The first active area and second active area are separated by a distance $\lambda$, the distance $\lambda$ allowing a leakage current to flow between the first and second active areas.

2 Claims, 3 Drawing Sheets

PROCESS SEQUENCE

| SLICE OF SUBSTRATE E.G. SILICON | |
|---|---|
| FORMATION OF GROOVES FOR CONTACTING | 101 |
| SURFACE ETCHING | 111 |
| TEXTURING | 112 |
| APPLICATION OF RESISTANCE REDUCING LAYERS | 121 |
| APPLICATION OF FIRST DOPANT SOURCE LAYER | 122 |
| DIFFUSION IN INERT GAS | 131 |
| DIFFUSION WITH GAS PHASE DOPANT SOURCE | 132 |
| ETCHING OF AUTO-DOPED AREAS | 141 |
| APPLICATION OF HIGH-DOPED LAYER OR PATTERN ON BACK SIDE | 151 |
| APPLICATION OF OPTIMAL SHUNT LAYER | 152 |
| APPLICATION OF SECOND DOPANT SOURCE LAYER | 153 |
| DIFFUSION | 161 |
| ETCHING | 171 |
| CONTACTING | |

FIG. I

BIFACIAL SOLAR CELL

This is a division of application Ser. No. 07/949,539, filed Jan. 14, 1993, U.S. Pat. No. 5,461,002.

FIELD OF THE INVENTION

The invention concerns a method of making doped areas on semiconductor components, preferably solar cells. The invention additionally concerns a solar cell with incorporated bypass diode, made according to the invention.

BACKGROUND OF THE INVENTION

A solar cell basically consist of a thin silicon wafer having a single large area of typically a PN junction which covers one side of the wafer facing the source of light. The photo-excited charge carriers flow to a front side metal contact and a back side metal contact, respectively, the former having a geometry such that substantially maximum collection of the charge carriers is accomplished, while the area of the metal contact covering the front surface of the cell and thereby blocking the light is minimized. The described solar cell is monofacial, i.e. the solar cell is only photo-active with respect to light impinging on the front side of the cell. By additionally providing a thin junction layer on the back side of the cell, this too may be made photo-active to form a bifacial solar cell. The solar cells may either have an intrinsic, P or N type substrate, while the doped layer or layers may either be $N^+$ or $P^+$.

It is known in the art to use an oxide containing dopant. The U.S. patent specification 4,101,351 describes how an oxide is grown on a crystal, following which parts of the crystal are exposed again to an oxide to define the active areas. This exposure typically takes place by adding to this oxide coated crystal a mask layer resistant to hydrofluoric acid, whereby the oxide layer will be etched away with hydrofluoric acid in the areas where the crystal is not coated with a photoresist layer. The crystal areas thus exposed can then be doped after removal of the photo-resist layer by diffusion of a suitable substance into the crystal at a high temperature, typically in the region about 1000° C. The dopant source material may be added by depositing on the exposed area of the crystal a layer of e.g. silica containing dopant source material. No undesirable auto-doping will take place since the rest of the crystal is protected with the oxide layer. The oxidation, photo-resist masking, etching;and doping process can be repeated several times so that the crystal will have the desired number of doped areas. The stated method has several shortcomings, including e.g. many complicated process steps, such as growing of the oxide on the surface of the crystal, which requires a temperature treatment about 1000° C., as well as requirements concerning pure surroundings in either pure oxygen or water vapour. Exposure of parts of the crystal surface normally requires the use of hydrofluoric acid which is an extremely difficult chemical to work with because of its toxicity.

The object of the invention is to provide a method of making doped areas on semiconductor components, preferably solar cells.

SUMMARY OF THE INVENTION

This object is achieved by applying to a portion of the surface of a semiconductor substrate an oxide forming mask layer containing a dopant, said semiconductor substrate with applied mask layer being heated to a temperature sufficient for diffusion of part of the dopant from the mask layer to the semiconductor substrate, where also undesirable auto-doping of the naked surface of a semiconductor substrate takes place during the doping process. The auto-doped areas of the semiconductor substrate are etched away e.g. by alkaline etching, including choline, potassium or sodium hydroxide, or plasma etching, while the mask layer constitutes a protection barrier for the doped areas below the mask layer. This makes the use of photo-resist masking superfluous, since the employed dopant source layers of silica satisfy several functions and thus also serve as a protection barrier for a doped area in subsequent doping processes. Further, the number of high temperature steps is reduced so that it substantially corresponds to the number of doping processes and may even be smaller than this number if a dopant source layer also serving as a barrier to a gas phase source is used. This is a significant advantage since repeated high temperature steps destroy the crystal structure of the wafer.

The invention is characterized by depositing on the semiconductor substrate a dopant source layer which serves a mask and protective layer when the auto-doped areas are etched away. The invention is unique in that several mutually separated doped areas of different types and concentrations can be produced by just a single high temperature step. The invention further includes solar cell provided with a bypass diode which is directed oppositely to the "photo diode", so that in case of partial shade or breaks the solar cell will serve as a conducting diode instead of cutting off electricity flow from the solar cell panel.

The method of making solar cells according to the invention is advantageous in that the use of hydrofluoric acid and photo-resist is avoided completely, so the method is very beneficial to the environment. Furthermore, the number of process steps and of high temperature treatment steps are reduced considerably, which is an advantage also from an economic point of view. Production of solar cells with a reasonable efficiency has previously been confined to laboratory environments because of huge requirements concerning clean environments and the use of many dangerous chemicals as well as advanced equipment. The present method does not make the same requirements with respect to the surroundings, and it is therefore, extremely suitable for use in enterprises having no access to high technology.

BRIEF DESCRIPTION OF THE DRAWINGS

The invention will be explained more fully in connection with preferred embodiments with reference to the drawing, in which FIG. 1 shows an example of a process diagram for the method of the invention, and FIGS. 2–8 schematically show various stages in the production of a preferred embodiment of a bifacial solar cell made according to the process diagram of FIG. 1.

DETAILED DESCRIPTION OF THE INVENTION

Figure 2:
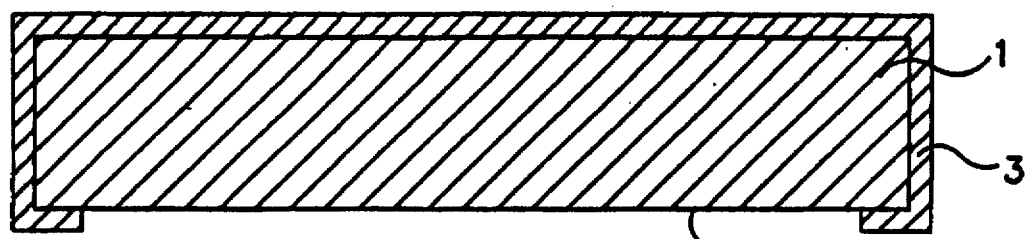

FIG. 1 shows a process diagram for the production of solar cells according to the invention. Before doped areas are formed in the substrate wafer, a number of treatment steps known per se is carried out, in which e.g. saw damage is removed and reflection properties are changed, said step being mentioned only briefly for the sake of completeness. Examples will also be given on how contacting of the finished semiconductor/solar cell can be carried out.

The substrate material is selected in response to a requirement made of the finished solar cell and, in the illustrated example, is selected as a silicon substrate of N type with a resistivity of 100 Ωcm. The substrate is a monocrystalline wafer with a (100) orientation and with a thickness before treatment of 350 μm, the wafer having minor saw damage to the surface because of sawing from a silicon rod ingot.

Owing to the final contacting a silica net pattern may be printed in step 101 with e.g. a thick film printing technique, where a series of contiguous depressions is formed by subsequent etching of the surface with e.g. KOH in step 111, in which contacting can take place so that the active areas will not be shaded. Alternatively, the mentioned depressions may be provided by laser grooving. For bifacial solar cells, the process is performed on both sides of the wafer.

To improve the efficiency of the solar cell, an otherwise known etching may advantageously be performed in step 112 with e.g. a choline solution to provide a pyramidal, textured surface with pyramid peaks of about 5 μm, and then the etching process is stopped as in the other etching processes by placing the wafer in a water bath and then drying it, whereby the wafer is purified chemically at the same time. If the surface of the solar cells is not textured, they may alternatively be coated with an anti-reflection layer, which can optionally be combined with one of the layers of dopant source material mentioned later. Anti-reflection layers will usually have a thickness of about ¼ wavelength.

Step 121 makes it possible to deposit a thin, patterned silica layer with a very high molar percentage of phosphorous on the front side of the wafer, which can be done by means of a thick film technique. The pattern is adapted so as to cover the depressions formed in substeps 101 and 111 and serves to reduce the contact resistance between the metal contacts and the silicon material. Since the high doping destroys the crystal structure, it is important that the propagation of the pattern is limited to the contact areas. The thickness of the layer may advantageously be restricted to 0.05 μm, and the line width in the pattern will usually be about ⅓ wider than the above-mentioned depressions. The metal material used for contacting is deposited when the manufacturing process is terminated, and on top of the highly doped silicon lines to avoid possible shortcircuit through the faintly doped areas. Furthermore, extra lines—in addition to those used for contacting—may be deposited, which then diminishes the requirement made of the metallized contact net since these extra lines then serve as a supplement to this and also permit light to pass.

In step 122 the silicon wafer 1 shown in FIG. 2 is provided with a low-doped silica layer 3, which may be done by any suitable technique, such as a thick film printing technique, spinning, spraying and CVD. Here, however, a spin-on technique is selected, where a silica solution is applied to the wafer 1 under rotation and will thus settle on the surface 2 of the wafer as a thin layer 3. By controlling various parameters, e.g. the rotary speed of the wafer and the viscosity of the silica, the propagation of the layer 3 may be controlled, including its extent on the back side or underside of the wafer. The layer 3 has several functions, but is primarily to serve as a dopant source. In addition, the layer 3 also protects against auto-doping from underlying, high-doped layers or patterns optionally deposited in step 121. It also protects the underlying layer against undesirable impurities and against the effects of subsequent etching. In addition, the layer 3 may be provided in a thickness such that it can serve as an anti-reflection layer on a finished solar cell. Thus, after drying at 100° C., the layer 3 may have a thickness of 0.15 μm.

To obtain a cell efficiency of the order of 18–25%, the deposition of the layer 3 and the contents of it are quite decisive, since such efficiency is conditional upon a low surface concentration. With a solar cell, the photo-current (current formed in the PN junction of incident light), is overlaid by an oppositely directed current (dark current), for which reason it is attempted to restrict the latter. A considerable cause of great dark current is many recombination centers at the surface (high surface recombination velocity), which may be neutralized by passivating the surface of the cell with a thin $SiO_2$ layer—a so-called passivation layer, which, however, is active only when the surface concentration of dopant impurities (here phosphorous atoms) is sufficiently low, i.e. less than about $2.5 \times 10^{18}$ $cm^{-3}$.

After part of the surface 2 on the wafer 1 has been coated with a dopant source layer, the cell is high temperature treated, which takes place in step 131 with a temperature: about 1100° C., preferably in an atmosphere of dry nitrogen, and the step has a duration of 15 minutes. The purpose of this treatment is to dope areas on the wafer by means of diffusion from the deposited layer 3 to areas at and directly below the surface of the wafer 1. This step 131 may be adjusted so as to provide effective gettering where undesirable impurities in the wafer are removed. If gettering is not needed, the high temperature step 131 may be prolonged and step 132 be omitted. Gas flow of pure nitrogen is used (without presence of oxygen) to avoid formation of an $SiO_2$ mask layer on the back side of the cell, which would otherwise prevent diffusion of gas-phase phosphorous from a $POCL_3$ source in step 132.

Figure 3:
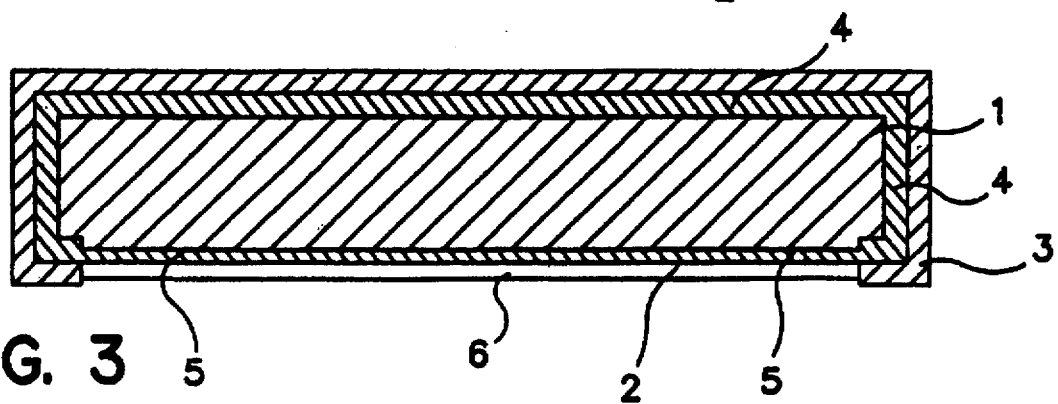
Figure 4:
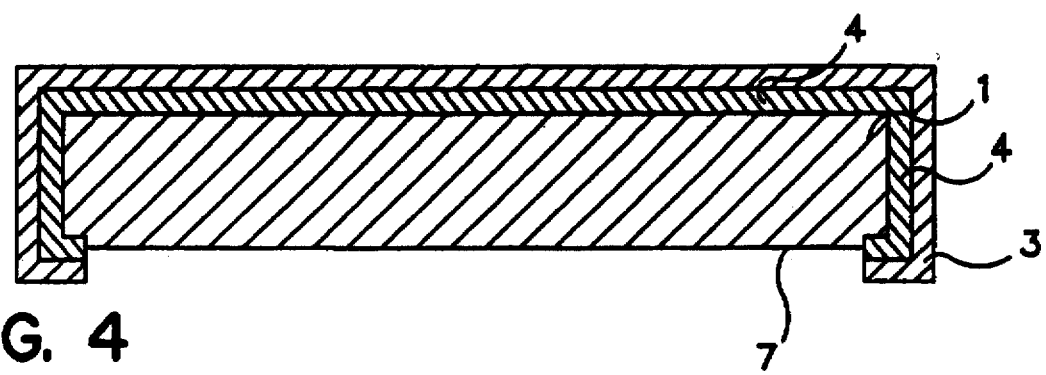

Formation of the doped junction area 4 shown in FIG. 3, where the phosphorous particles used for formation of an N area come from the silica layer deposited in step 122, takes place in step 131, where the silica layer 3 is densified additionally to provide a masking effect on the front side against undesirable ingress of a large number of phosphorous, atoms in step 132. The invention is unique in that several mutually separated doped areas of different types and concentrations can be produced in just a single high temperature step.

At the transition to step 132 the temperature of 1100° C. is maintained while the wafers are moved to another zone in the furnace, where the atmosphere contains oxygen and a carrier gas from the $POCl_3$ source. This part of the high temperature treatment takes 15 minutes and is terminated with slow cooling during which the $POCl_3$ source is disconnected. The slow cooling is necessary to derive full benefit from the gettering process. Furthermore, rapid cooling is inexpedient with respect to maintaining the crystal structure since crystal flaws may occur, which reduces the diffusion length of the minority charge carriers and thereby the efficiency of the cell. It is thus essential that steps 131 and 132 take place in the same diffusion chamber or furnace without intermediate cooling and heating. New crystal flaws occur for each cooling and heating. The 1100° C. may be varied within wide limits, but is selected as a typical example for clarity.

As will be seen in FIG. 3, a doped area 5 will be formed from the gas phase source, on which an oxide layer 6 is formed during diffusion.

During diffusion a strongly doped phosphorous silica layer is formed over the back side in particular, which, however, is removed by the etching in step 141. A diffused layer may be characterized by means of the parameters junction depth and surface resistance (ohms per area). The junction depth is the distance from the surface, to the point where the concentration of a first type of dopant impurities is equal to the concentration of a second type of dopant impurities in the substrate, i.e. where there is electrical balance between the P and the N type dopant impurities, also called acceptor atoms and donor atoms, respectively.

Etching in step 141 may advantageously be performed with choline, whereby the thin phosphorous oxide layer 6 of the back side is etched away so that the impurities embedded. therein are removed together with the outermost 5 µm of silicon. After cessation of etching, the silica layer of the front side is likewise reduced and now has a thickness of about 0.1 µm. Etching may advantageously be selective so that the pyramid structure is maintained, but this involves the risk that the texturing will not be nearly as uniform as prior to etching, since some of the pyramids are etched more rapidly than others. The pyramids on the back side will be 5 µm higher than the pyramid on the front side after etching. The etching rate is many times greater in the (100) direction in relation to the (111) direction in particular, and it is therefore important to ensure that the etching depth (here 5 µm) is greater than the penetration depth in the back side (here 3 µm) of the phosphorous atoms from the gas phase external source in step 132.

Like in step 121, a silica layer with a very high molar percentage of boron can now be deposited on the back side of the wafer in step 151, which can take place by means of a thick film printing technique. The thickness of the layer is 0.1 µm after drying at 150° C., and in addition to being a dopant source for the high-doped contact area it also serves an additional protection mask against ingress of undesirable metal material. Otherwise, the pattern corresponds to the pattern used in step 121 and covers, in the same manner, the contacting grooves formed in step 101.

Figure 5:
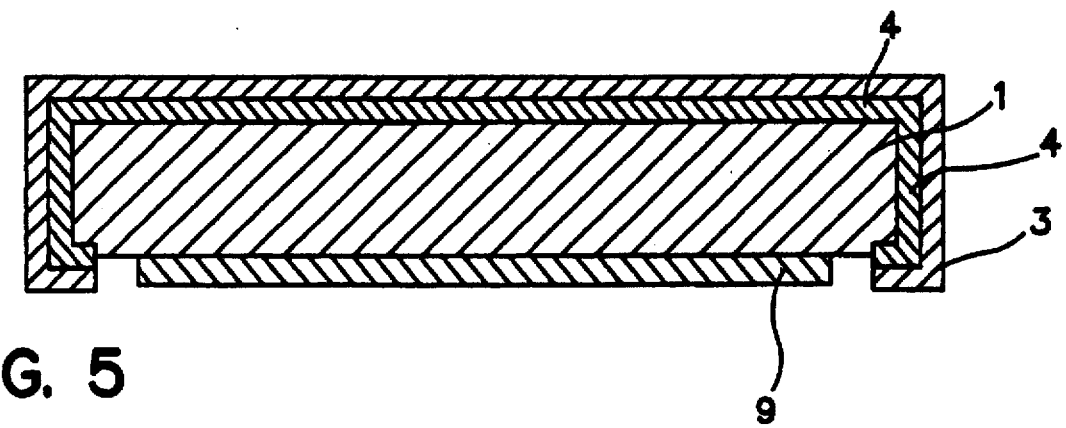

If the diode is to be provided with a bypass diode mentioned later, the back side is provided along the edge with a silica layer with a high molar percentage of phosphorous, which can expediently take place by means of a thick film technique, which is effected in step 152. Then a silica layer (FIG. 5) with a low molar percentage is deposited on the back side, which takes place in step 153, and this can expediently, be effected by a thick film printing technique. The layer 9 (FIG. 5) covers the entire back side except an annular area along the edge of the wafer. The thickness of the layer is about 0.1 µm after drying at 100° C. The low molar percentage ensures that the surface concentration does not exceed $8 \times 10^{18}$ boron atoms per $cm^3$ outside the contact area. The concentration of boron is higher than the previously mentioned concentration of phosphorous, the reason being that boron diffuses more slowly than phosphorous and that the concentration must be increased to obtain the same low surface resistance. In addition, it should be considered that in the high temperature treatment in step 161 phosphorous penetrates deeper down into the wafer through diffusion. A solution to this problem is to begin by depositing a boron layer (steps 121–122) and then deposit a phosphorous layer (steps 151–153).

The diffusion in step 161 takes place at 1000° C. in a dry atmosphere of nitrogen and oxygen for 30 minutes. The high temperature step is terminated with a very slow cooling in an oxygen-rich atmosphere to form an 0.01 µm thick surface passivation layer, which takes place best by dry oxidation. It should be noted that the oxide grows at the surface of the silicon crystal and not on the doped silica layers. Cooling is very important here, and the best result is obtained with a very slow cooling (about 2° C./minute).

In step 161, boron penetrates from the silica layer 9 into the wafer in an area 10 directly below the silica layer 9. In the naked area between the two silica layers auto-doping of the area 11 will take place, and an oxide 12 will be formed on top of this. The doped area 4 will propagate slightly during the diffusion process.

Figure 7:
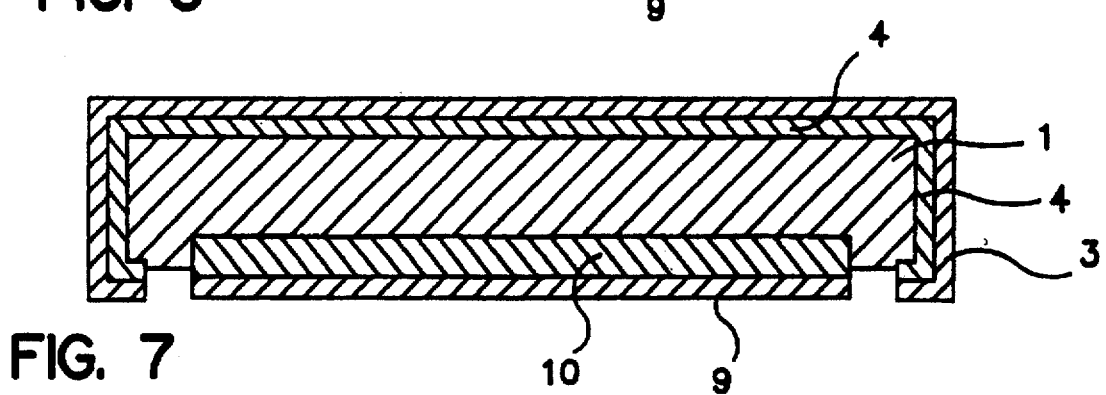

It will be seen in FIG. 7 how etching in step 171 removes the auto-doped area 11 and the oxide 12 formed thereon. Etching is performed with a hot choline solution so that 2 µm of silicon is removed from the surface in the area between the silica layers. During the etching process the thickness of the silica layers 3 and 9 is reduced to 0.01 µm to make it possible to apply a better number of reflection layers in the subsequent steps. The silica layer may be etched away advantageously because in this case it mainly consists of $SiO_2$ which has a lower index of refraction (typically 1.45). With a higher index of refraction a better anti-reflection layer is obtained. Alternatively, it might have been decided to use $TiO_2$ with a refractive index 2.1 for the layers 3 and 9 and to maintain this. Additionally, it might have been decided to combine this layer with another anti-reflection layer, e.g. $Ta_2O_5$, ZnS, or $MgF_2$ to provide a double layer, which gives a better anti-reflection effect.

Then contacts may be applied in a known manner, which will be known to a skilled person and will therefore not be mentioned in greater detail. The process diagram has been explained with reference to a bifacial solar cell, but may be interrupted after etching in step 141 to provide just a monofacial solar cell which is then ready for contacting.

It may thus be said that a plurality of positive effects is obtained by using a silica layer both as a dopant source and as a mask. In the production of a monofacial solar cell one side of the substrate wafer is coated with a silica layer which serves partly as a source material and partly as a mask layer. With a high temperature step atoms from the dopant source diffuse directly into the underlying part of the wafer and through the air into the unprotected back side of the wafer in the form of auto-doping. The auto-doped part of the wafer is removed by the subsequent etching, while the silica layer protects the underlying doped area. The wafer can then be contacted and used as a monofacial solar cell.

Figure 6:
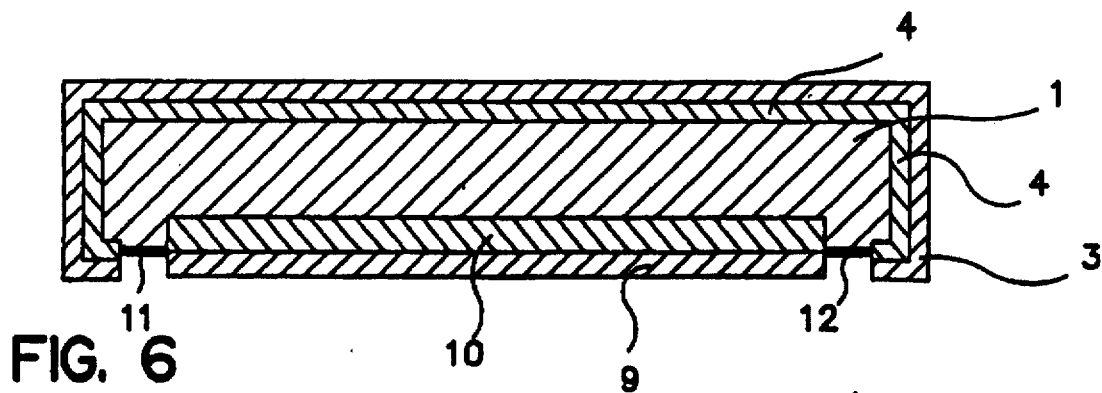
Figure 8:
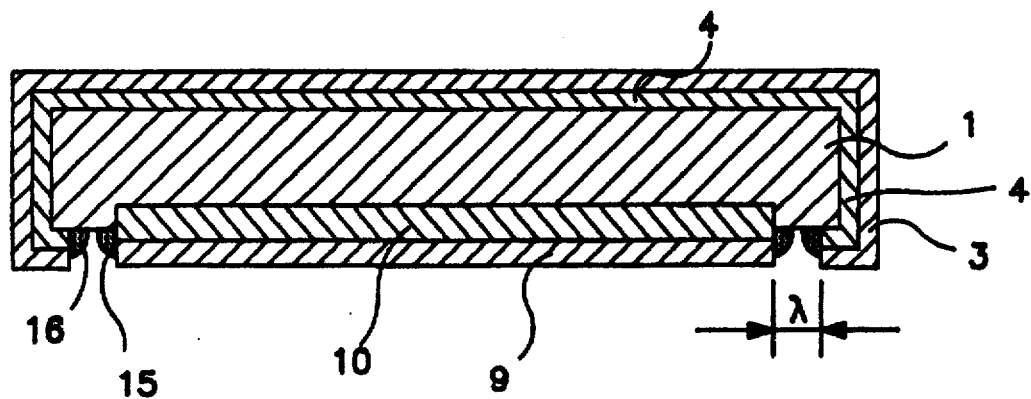

It will be seen in FIG. 8 how the area 11 doped from the gas phase dopant source is not, removed completely by the final etching in step 171. Thus, there is formed an annular channel with the junction layer in the bottom provided in step 152. The channel has a width which is expediently greater than the respective penetration depths of the doped areas 4 and 10. The distance λ between the two silica layers 3 and 9 may be used for adjusting the gradient of the dark current with the diode formed by the semiconductor layers biased in the blocking direction, thereby reducing the hotspot risk. The distance λ is decisive for the leakage current between the $N^+$ and $P^+$ areas. When the solar cells are thus provided with a diode effect, a large solar cell panel will continue to operate even if one or more individual solar cells become defective or are shaded. The mentioned diode effect can be obtained by removing the auto-doped area, mentioned in connection with FIG. 6, by selective etching so that the annular channel is exposed to the underlying wafer 1, while there will still be a residual portion of the layer 11 along the edges to the active areas 4 and 10. Since the layer 11 is formed by auto-doping from the source layer 9 and is therefore of the same conductivity type as the active area 10, the rest of the layer 11 facing the area 10 will accordingly be considered an integral part of this, while the rest facing the area 4 will be considered a doped area 16 (FIG. 8) of a conductivity type different from the active area 4. An area 15 of the same conductivity type as the area 4 is subsequently contacted with the area 10 in the channel to provide a PN or PIN junction. The area 15 may e.g. be formed in connection with contacting and may thus be of aluminium. This semiconductor junction forms a diode which is directed oppositely to the "photo diode" formed by the solar cell and ensures that the panel, in which a solar cell is arranged, continues to operate even if the solar cell is made inoperative, e.g. by a break, shade or the like. With a monocrystalline starting material the diode extends transversely to the annular channel, while with a polycrystalline starting material the diode consists of segments transverse to the channel and therefore consists of several diodes connected in parallel.

The source layers have been mentioned as silica layers with boron or phosphorous in the foregoing, but it will be appreciated that the dopant may be selected arbitrarily from e.g. antimony and arsenic. Silica, which usually covers a silicon and oxygen containing material forming quartz by strong heating and addition of oxygen, may e.g. be replaced by silicon nitride, titanium oxide, or another material having the necessary properties as a barrier layers. The starting material in the example previously described was a monocrystalline silicon wafer, and this may be replaced by a polycrystalline wafer or even by an amorphous wafer, the material being selected in dependence upon the desired properties of the solar cell.

As will be appreciated from the foregoing, the wafer may be coated with more source layers of different conductor types, which, with common diffusion, serve both as a source layer and as a mask layer against undesirable auto-doping. The layers may be applied in ordinary manner by e.g. CVD, spin-on or a thick film printing technique. It is thus possible to manufacture a bifacial solar cell in a single high temperature step where auto-doped areas are removed by subsequent etching. It will likewise be appreciated that the technique outlined here is useful for the production of doped areas for many different semiconductor types, including thyristor. Thus, an arbitrary structure of doped areas may be formed in a semiconductor.

The etching agent has been described as an alkaline solution in the foregoing, but the etching step may advantageously be replaced by plasma etching, so that both the diffusion step and the etching step take place in one and the same furnace chamber without the wafers having to be moved between the steps. A significant advantage of this will thus be that the furnace pipe is cleaned during etching, and that the subsequent process steps with water flushing, chemical cleaning, and drying are obviated.

I claim:

1. A bifacial solar cell which comprises:

a semiconductor substrate wafer;

a first active area of a first conductivity type provided on at least a part of a first side of said wafer;

a second active area of a second conductivity type provided on a second side of said wafer, the edge face of said wafer, and the periphery of said first side of the wafer; and said first active area and second active area being separated by a third area, said third area being provided with a third ring-shaped active portion of the second conductivity type and a fourth ring-shaped active portion of the first conductivity type, said third active portion abutting said first active area and said fourth active portion abutting said second active area, whereby said first and second active areas provide a first PN junction and said third and fourth active portions provide a second PN junction, said two PN junctions being directed opposite in polarity to each other.

2. The bifacial solar cell of claim 1, wherein said first active area and said second active area are coated with an anti-reflection layer.

* * * * *